United States Patent [15] 3,688,305
Goldsworthy [45] Aug. 29, 1972

[54] PULSE HEIGHT ANALYZER WITH DIGITAL READOUT

[72] Inventor: William W. Goldsworthy, Orinda, Calif.

[73] Assignee: The United States of American as represented by the United States Atomic Energy Commission

[22] Filed: Nov. 18, 1970

[21] Appl. No.: 90,532

[52] U.S. Cl......340/347 NT, 340/347 AD, 324/99 D
[51] Int. Cl..............................................H03k 13/20
[58] Field of Search...............235/183; 324/76 A, 99; 328/127; 340/347

[56] References Cited

UNITED STATES PATENTS 3,267,458 8/1966 Anderson et al. .........340/347
3,463,912 8/1969 Lerman et al..........328/127 X
3,368,149 2/1968 Wasserman .................324/99
3,525,093 8/1970 Marshall....................340/347

FOREIGN PATENTS OR APPLICATIONS 45,535 1/1970 Japan ........................340/347

*Primary Examiner*—Maynard R. Wilbur
*Assistant Examiner*—Charles D. Miller
*Attorney*—Roland A. Anderson

[57] ABSTRACT

A feedback-controlled pulse-amplitude integrator and amplifier used as an analog-to-digital converter that converts event-liberated charges, emanating from a nuclear-particle detector, directly to numbers rather than to analog-dependent voltages.

2 Claims, 2 Drawing Figures

PATENTED AUG 29 1972 3,688,305

INVENTOR.
WILLIAM W. GOLDSWORTHY
BY

PULSE HEIGHT ANALYZER WITH DIGITAL READOUT

BACKGROUND OF THE INVENTION

The invention disclosed herein was made in the course of, or under Contract W-7405-ENG-48 with the United States Atomic Energy Commission.

In a conventional pulse-height detection system, pulses from a nuclear radiation detector are amplified by a linear amplifier to amplitudes suitable for analysis by a pulse-height detector and the results are converted to digital form for storage. Such a conventional system is relatively complex in that digital read-out is obtained in an indirect manner by digital conversion of analog-dependent voltages, rather than directly. In addition, the accuracy of the system is highly dependent upon the linearity of the amplification required to develop the analog-dependent voltages. Linear pulse amplifiers are relatively difficult to design to meet numerous rigorous requirements, such as fast recovery time, stability, overload immunity, low noise, and the like.

SUMMARY OF THE INVENTION

The general object of the present invention is to provide a pulse height analyzer having a feedback-controlled pulse-amplitude integrator and amplifier used as an analog-to-digital converter that converts event-liberated charges from a nuclear-particle detector directly to numbers rather than to analog-dependent voltages, whereby greater overall circuit simplicity and improved overload performance are obtained and substantially reduced dependence upon amplifier circuit stability is required.

In the accomplishment of the foregoing and other objects and advantages, a pulse height analyzer in accordance with the present invention generally comprises an amplifier, that need not be linear, having an integrating input stage for receiving event-liberated charge pulses emanating from a nuclear-particle detector. Level sensing comparator means coupled to receive the integrated output of the amplifier sense departures therein from a balanced condition and establish a demand for restoration of the input charge to its original balanced condition. Charge injection means coupled to the integrating input stage are controlled responsive to establishment of a restoration demand by the comparator means to inject a discrete number of recharge impulses to the input at a rate determined by a local clock to re-establish the original balanced state of the input charge. Means are provided to count and read out the number of recharge impulses as a direct digital indication of the amplitude of the event liberated charge.

DETAILED DESCRIPTION OF THE INVENTION

Figure 1:
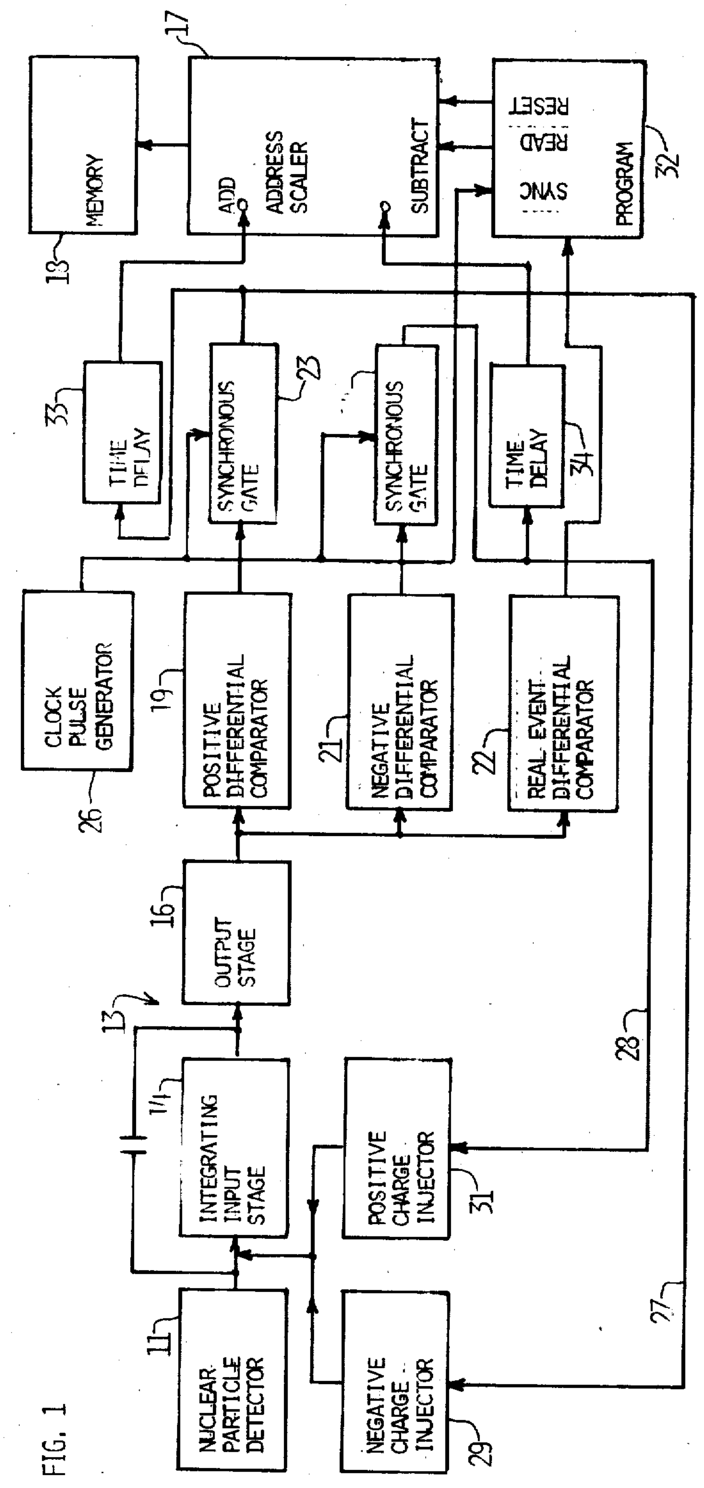
FIG. 1 is a circuit block diagram of a pulse-height analyzer with digital readout in accordance with the present invention.

Referring now to FIG. 1 in detail there is shown a nuclear-particle detector 11 coupled to the input of a pulse height analyzer in accordance with the present invention which is arranged to convert the amplitudes of event-liberated charges emanating from the detector directly to digital form for read out. The analyzer includes an amplifier 13 including a charge sensitive integrating input stage 14 coupled to detector 11 to provide an output voltage proportional to differential accumulated charge liberated from the detector. In the illustrated case, the amplifier additionally includes a moderate gain direct coupled output stage 16 to further amplify the integrator output voltage to a sufficient level to properly drive output components of the system subsequently described.

In accordance with the particularly salient aspects of the invention the integrating input stage 14 is employed as a null amplifier to control the rate of flow of input recharge pulses, developed in a manner subsequently described, necessary to counteract event liberated input and leakage charges from the detector 11 and re-establish an original state of input balance. The number of these recharge pulses needed for differential input balance is summed in an address scaler 17 for subsequent transfer into a memory 18 as a number representative of the event liberated charge.

In order to accomplish the foregoing, level sensing differential comparator means are provided to sense departures from a balanced condition of the output of amplifier 13 and establish a demand for metered charge nulling of the input integrator 14 at an injection rate determined by a local clock, thereby restoring the input charge to an original state corresponding to the balanced output condition. More particularly, the comparator means preferably include a positive level sensing differential comparator 19, a negative level sensing differential comparator 21, and a real event differential comparator 22 having inputs commonly coupled in receiving relation to the output stage 16 of amplifier 13. Comparators 19 and 21 sense the polarity of small amplifier output base line shifts from a balanced condition and responsively generate charge demand representative step signals at their outputs. The comparator 22 senses positive shifts in the amplifier output base line of predetermined magnitude sufficient to exceed amplifier noise and be thereby indicative of the presence of a real event. In response to such a shift of predetermined magnitude, comparator 22 generates an event indicative step signal at its output.

The outputs of positive and negative level comparators 19 and 21 are respectively coupled in gating relation to synchronous gates 23 and 24 having inputs commonly coupled in receiving relation to the output of a clock pulse generator 26. Thus, clock pulses at a predetermined fixed clock rate are gated to the outputs of the gates 23 and 24 respectively in response to positive and negative shifts in the output of amplifier 13 from balanced condition.

The outputs of gates 23 and 24 are respectively coupled via lines 27 and 28 in triggering relation to the inputs of negative and positive charge injectors 29 and 31, the outputs of which are coupled to the input circuit of the integrating input stage 14 of amplifier 13. The charge injectors are arranged to inject precise impulses of charge, i.e., current pulses of precise magnitude and duration, to the integrator input in response to each triggering clock pulse. Thus, whenever the amplifier is unbalanced in the positive direction, comparator 19, gate 23, clock generator 26, and negative charge injector 29 effect the flow of resetting metered negative charge impulses to the integrator input until the balanced condition is restored. Conversely, when the amplifier is negatively unbalanced, comparator 21, gate 24, clock generator 26, and positive charge injector 31 restore the balanced condition by effecting the flow of resetting metered positive charge impulses to the integrator input.

Summing in the address scaler 17 of the charge impulses required to restore amplifier balance in response to the occurrence of a real event liberated at detector 11 is facilitated by coupling of the output of the comparator 22 in triggering relation to a reset and read program 32 for the scaler. The program is arranged to reset the scaler in response to the leading edge of an event indicative step signal from the comparator and deliver a delayed read command to the scaler in response to the trailing edge of such signal. The outputs of gates 23 and 24 are coupled by means of time delays 33 and 34 respectively to add and subtract inputs 36 and 37 of the scaler.

In the overall operation of the pulse height analyzer 12 with an event liberated charge applied from detector 11 to the integrating input stage 14 of amplifier 13, the resulting positive unbalance at the output of the amplifier is sufficient to trigger the real event comparator 22, as well as positive level comparator 19. The leading edge of the real event indicative step signal at the output of comparator 22 as applied to program 32 effects resetting of the scaler 17. Simultaneously, the charge demand signal at the output of comparator 19 opens gate 23 to effect the injection of negative resetting metered charge impulses from injector 29 to the input circuit of integrator stage 14 at a rate determined by the clock pulses from clock generator 26. The gated clock pulses corresponding to the number of injected negative charge impulses are applied to the add input 36 of scaler 17 after a time imposed by time delay 33 sufficient to insure prior resetting thereof. When the original input charge conditions are reestablished, both the positive and negative comparators 19 and 21 are triggered nearly equally from amplifier noise. As soon as triggering of the negative comparator 21 recommences, subtract pulses are sent to the subtract input 37 of the scaler simultaneously with the injection of positive resetting metered charge impulses from injector 31 to the input circuit of the integrator 14. At this time the real event indicative signal terminates and a delayed read command is sent to the scaler to transfer its count to memory 18, the delay insuring sufficient time for full initial charge recovery and time averaging of the base line null before read out.

The true numerical value transferred into the memory is the difference between the number of impulses respectively originating from the negative and positive injectors 29 and 31 during the real event sampling interval. This provides true signal averaging over a fixed time period, i.e., integration, and allows for accurate assesment of the true zero. In between event occurences, the positive and negative comparators 19 and 21 supply a metered feedback stabilization for the null seeking system by subtracting or adding charge to the integrator's input on demand in order to maintain a zero amplifier output voltage balance, i.e., differentiation.

It is of importance to note that any instability or poor linearity characteristics existing in the null amplifier circuitry of the present invention will produce only small system instabilities and non linearities because of the overall input injection feedback technique employed. Since any displacement from the original output voltage of the null amplifier 13 will demand charge injection for resetting of input conditions, amplifier linearity is unimportant. Also since charge is subtracted upon demand at the input of integrator 14 during and after each event, less total charge is accumulated in the integrator at any given time, thereby providing improved overload and linearity performance. Instabilities in amplifier gain only result in varying the operating rate of the positive and negative injection gates 23 and 24 which maintain amplifier base line stability, and these variations tend to average to zero if well balanced. Good overload performance is insured since all stages are direct coupled and charge restitution to the input is all that need be satisfied for complete overload recovery.

Considering now the charge injectors 29 and 31 in more detail, it is to be noted that overall system performance may be adversely effected by the addition of noise generating devices at the input circuit of the integrating stage 14 of amplifier 13 or by inaccurate control of charge reinjection. Consequently, the charge injectors are designed to add minimum noise to the integrator input and to provide accurate metering of minute charges. In this regard, very low noise charge injection may be accomplished with a minimum of components and complexity in the manner illustrated in FIG. 2. Accurately metered pulsed radiation exciting charge pair production in the charge depletion regions of semiconductor devices is the charge injection technique employed in the embodiment of FIG. 2. Depletion regions in transistors, field effect transistors, and solid state nuclear particle detectors can be so excited. Light radiation has been successfully employed to excite such low level charge pair production in semiconductors in conjunction with an opto-electric charge feedback technique in the manner disclosed in a paper by Kandiah, National Academy of Sciences, Pub. 1593, 1969, pages 495 - 505. The present technique is generally similar except that instead of a gross radiation induced charge, accurately metered radiation induced groups of charge are reinjected into the amplifier's input upon demand.

Figure 2:
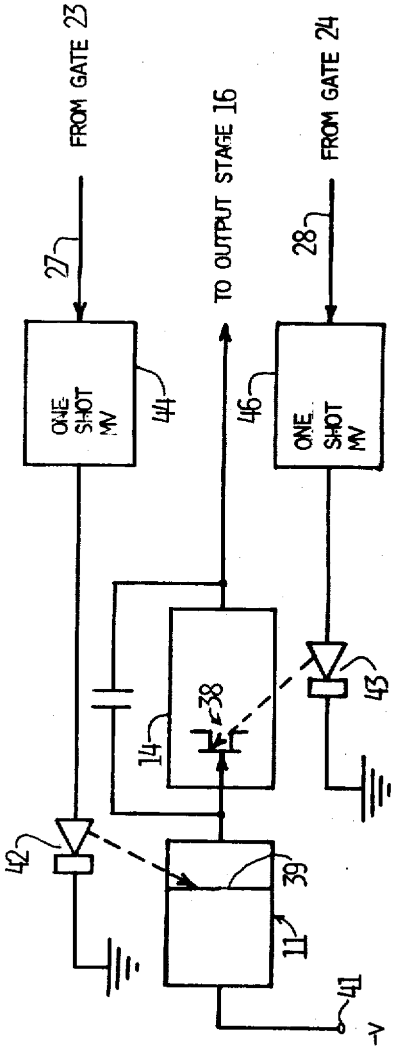
FIG. 2 is a circuit block diagram of one form of charge injection means which may be employed in the analyzer of FIG. 1.

Referring to FIG. 2 in detail, a field effect transistor (FET) 38 is preferably employed as the input element of integrating input stage 14 of amplifier 13. The nuclear particle detector 11 is then provided as being of the solid state semiconductor diode type having a PN junction 39. The N region of the detector is connected to the gate terminal of FET 38, and the detector is reverse biased by connection of its P region to a bias terminal 41 maintained at a negative bias −V. The charge injectors 29 and 31 are then preferably provided as pulsed light, or equivalent radiation sources, such as galium arsenide light emitting diodes 42 and 43, arranged to beam metered light pulses on respectively the junction 39 of diode detector 11 and the gate-drain junction of FET 38. Light impinging on such junctions produces charge pair production proportional to the total light radiation of the pulsed light emitting diodes 42 and 43, and thereby results in the injection of negative and positive charges to the input of the amplifier. In order that the light pulses be metered and generated upon demand developed responsive to unbalance at the output of the amplifier, diodes 42 and 43 are preferably respectively connected between ground and the outputs of a pair of one shot multivibrators 44 and 46, the inputs of which are connected to lines 27 and 28 from gates 23 and 24. Thus, in response to each clock pulse transmitted from gate 23 due to positive unbalance at the output, multivibrator 44 is triggered and diode 42 is thereby energized for a fixed period of time. The diode in turn delivers a metered light pulse to the junction 39 of particle detector 11 commensurate with injection of a negative charge impulse to the input of integrator 14. Similarly in response to each clock pulse transmitted from gate 24 due to negative unbalance at the output, multivibrator 46 is triggered to energize diode 43 for a fixed period of time, resulting in the delivery of a metered light pulse to the gate-drain junction of FET 38. A metered positive charge impulse is responsively delivered to the input of integrator 14. It will be therefore appreciated that except for the particular mechanism employed for charge injection, the operation of the system is the same as that previously set forth.

Although the invention has been hereinbefore described and illustrated in the accompanying drawing with respect to what may be considered preferred embodiments, it is to be noted that various changes and modifications may be made therein without departing from the true spirit and scope of the invention. For example, although a serial type of analog-to-digital conversion digitizing has been hereinbefore described in detail, a more sophisticated successive approximation type of digitizing and resetting of input charge may be alternatively employed with an attendent reduction in the time necessary for event digestion.

Thus, it is not intended to limit the invention except by the terms of the appended claims.

What I claim is:

1. A pulse height analyzer with digital readout comprising:

a nuclear particle detector for liberating charge pulses in response to nuclear events;

an amplifier including an integrating input stage with an input circuit connected to said detector to receive said charge pulses therefrom;

level sensing comparator means coupled to receive the integrated output of said amplifier and sense departures therein from a balanced condition, said comparator means being effective in response to a departure to generate a demand signal for restoration of the input charge of said integrating stage to an original state productive of said balanced condition;

charge injection means coupled between said comparator means and the input circuit of said integrating input stage to inject a discrete number of metered recharge impulses thereto at a fixed rate to restore said balanced condition responsive to said demand signal; and means coupled to said charge injection means to count and read out said number of recharge impulses as a direct digital indication of differential input charge;

said comparator means comprising a positive level sensing comparator for developing a negative recharge demand step signal responsive to positive departures in the output of said amplifier from a balanced condition, a negative level sensing comparator for developing a positive recharge demand step signal responsive to negative departures in the output of said amplifier from a balanced condition, and a real event comparator for developing an event indicative step signal responsive to positive departures of predetermined magnitude in the output of said amplifier from a balanced condition;

said charge injection means comprising a clock pulse generator for generating clock pulses at a predetermined fixed rate, first and second gates coupled to said clock generator to receive said clock pulses therefrom, said positive and negative level sensing comparators respectively coupled in gating relation to said first and second gates to gate transmission of said clock pulses therethrough in the presence of said negative and positive recharge demand signals, and negative and positive charge injectors coupled to the input circuit of said integrating input stage, said first and second gates respectively coupled in triggering relation to said negative and positive charge injectors to effect injection of metered recharge impulses therefrom in response to said clock pulses, and the count and readout means being coupled to said first and second gates and to said real event comparator to count the difference between said clock pulses transmitted from said first and second gates for the duration of said event indicative signal;

said count and readout means comprising an address scaler having add and subtract inputs and a reset and read program associated therewith for delivering reset and read commands to the scaler upon actuation of the program, time delays respectively coupling said first and second gates to said add and subtract inputs of said scaler, and means coupling said real event comparator to said program for actuation thereof in response to said event indicative signal.

2. A pulse height analyzer according to claim 1, further defined by said integrating input stage including a FET in its input circuit, said detector being of the solid state semiconductor diode type having a PN junction, said detector connected to the gate terminal of said FET, said charge injectors comprising light emitting diodes for beaming metered light pulses on the gate-drain junction of said FET and the PN junction of said detector in response to said clock pulses from said gates.

* * * * *